(12) United States Patent  (10) Patent No.: US 6,498,516 B2
Yau  (45) Date of Patent: Dec. 24, 2002

(54) MINIMIZING THE EFFECT OF CLOCK SKEW IN BIT LINE WRITE DRIVER

(75) Inventor: Tao-ying Yau, Cupertino, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 09/855,353

(22) Filed: May 15, 2001

(65) Prior Publication Data

US 2002/0171463 A1 Nov. 21, 2002

(51) Int. Cl.⁷ ............................................... G01R 19/00
(52) U.S. Cl. ..................... 327/55; 327/67; 327/312; 365/196; 365/207
(58) Field of Search .................. 327/51, 52–55, 327/56, 57, 65–67, 309, 310, 312, 316, 323, 392, 563; 365/189.05, 189.06, 189.07, 194, 196, 206, 207, 154, 156, 189.11, 203, 189.04; 330/252, 253; 326/98, 95, 94, 115

(56) References Cited

U.S. PATENT DOCUMENTS

| 4,973,864 A | * 11/1990 | Nogami | 327/208 |
| 5,977,798 A | * 11/1999 | Zerbe | 326/115 |
| 6,147,514 A | * 11/2000 | Shiratake | 327/55 |

* cited by examiner

Primary Examiner—Timothy P. Callahan
Assistant Examiner—Minh Nguyen
(74) Attorney, Agent, or Firm—Rosenthal & Osha L.L.P.

(57) ABSTRACT

A system for minimizing the effect of clock skew in a bit line write driver includes a first control circuit coupled to the bit line write driver; and a second control circuit coupled to the bit line write driver. The bit line write driver outputs a first output signal and a second output signal. A method of minimizing the effect of clock skew in a bit line write driver includes outputting a first signal and a second signal from the bit line write driver; controlling the outputting of the second signal from the bit line write driver based on a feedback of the first signal; and controlling the outputting of the first signal from the bit line write driver based on feedback of the second signal.

5 Claims, 5 Drawing Sheets

MINIMIZING THE EFFECT OF CLOCK SKEW IN BIT LINE WRITE DRIVER

BACKGROUND OF INVENTION

In computer and information processing systems, various integrated circuit chips must communicate digitally with each other over common buses. The receiving bus nodes recognize the signal as being high or low using receivers, also referred to as input buffers. Often the receiver is a differential receiver, i.e., a receiver that detects the difference between two input signals, referred to as the differential inputs. These input signals may be a received signal and a reference voltage or they may be a received signal and the inverse of the received signal. In either case, it is the difference between the two input signals that the receiver detects in order to determine the state of the received signal.

Integrated circuits are powered at certain voltage levels, which levels are then provided to the various components, such as the receivers, which are located on the integrated circuit. However, the nominal supply voltage for integrated circuits keeps being decreased to reduce power consumption. Additionally, fluctuations of the voltage level during operation can make the voltage level powering a receiver even lower. The lower the supply voltage, the more challenging it is to get a receiver to operate reliably.

The signal frequency at which communication occurs can limit the performance of the overall system. Thus, the higher the communication frequency, the better. The maximum frequency at which a system communicates is a function not only of the time that it takes for the electromagnetic wavefronts to propagate on the bus from one chip to another, but also of the time required for the signals to be reliably recognized at the receiving bus nodes as being high or low. Characteristics that affect the time in which a signal is recognized by a receiver include the set up time of the receiver, i.e., the amount of time before a clock edge that a signal must arrive and settle to a recognized level, and the hold time of the receiver, i.e., the time that the received signal must stay at a certain level in order for that level to be detected.

The amount of setup and hold depends on the speed of the circuit and the skew and jitter of the clock distribution mechanism. The setup and hold time requirement decreases as the transistor speed increases because the process feature size decreases. However, historically, skew and jitter of the clock distribution mechanism does not decrease as fast as the clock speed increases. As a proportion of the clock frequency, skew and jitter now take up a larger and larger percentage of the clock cycle time. Additionally, as the process feature size shrinks the transistor speed increases faster than the delay in interconnects. For signals that need to be distributed through a long interconnect (wire) the receiver of that signal at the beginning of the long wire receives the signal earlier (have a better setup time) than the receiver at the end of the long wire because of interconnect delay.

On the other hand, the receiver at the beginning of the long wire has worse hold time (premature signal switching) than the receiver at the end of the long wire. The end result is extra guard-banding is needed when quantifying setup and hold timing and this guard band, like jitter and skew and the delay of interconnect, becomes a larger and larger percentage of the clock cycle time.

Referring to FIG. 1, a conventional write driver (10) outputs two signals (wd and $\overline{\text{wd}}$) through delays (12a and 12b) to a switch (14). The switch (14) also receives a clock signal (clk) that controls whether the write driver data is output onto the global bitline (gbl) and its complement ($\overline{\text{gbl}}$). As is conventionally understood, the two output signals (wd and $\overline{\text{wd}}$) are complements unless the circuit is in a precharge or reset state. Those skilled in the art will also appreciate that the switch (14) may receive a clock-derived signal rather than the clock signal itself.

Referring to FIG. 2, a typical write driver (10) and delay stage (12) is shown. The write driver (10) consists of two sets of transistors, which produce the output signals (wd and $\overline{\text{wd}}$) respectively. Specifically, the set of transistors producing the output signal (wd) includes a p-channel transistor (22a), a p-channel transistor (24a), and an n-channel transistor (26a). The p-channel transistor (22a) receives the clock signal (clk) at the gate, is connected at the source to pull-up voltage (Vcc), and is coupled drain to drain with p-channel transistor (24a). The p-channel transistor (24a) is also connected to pull-up voltage (Vcc) at the source, and is coupled gate to gate with n-channel transistor (26a). The n-channel transistor (26a) receives an input signal (Vin) at the gate, and at the source is coupled through pull-down transistor (28) to ground (GND). The pull-down transistor receives the clock signal (clk) at the gate, is coupled to n-channel transistor (26a) at the drain, and connected to ground (GND) at the source.

The set of transistors producing ($\overline{\text{wd}}$) are connected similarly, wherein transistors 22b, 24b, and 26b have the same interconnections as 22a, 24a, and 26a respectively. As can be seen, however, the input signal received by n-channel transistor (26b) passes through inverter (30) to become ($\overline{\text{Vin}}$). Thus, the output of the two sets of transistors are complements (wd and $\overline{\text{wd}}$). The output signals (wd and $\overline{\text{wd}}$) are fed to the delay stage (12), which, for example, consists of two pairs of inverters (38a, 38b and 37a, 37b) and (38c, 38d and 37c, 37d) respectively.

SUMMARY OF INVENTION

In general, in one aspect, the present invention involves a system for minimizing the effect of clock skew in a bit line write driver comprising a first control circuit coupled to the bit line write driver; and a second control circuit coupled to the bit line write driver. The bit line write driver outputs a first output signal and a second output signal; the first control circuit receives feedback from the second output signal and controls whether the bit line write driver outputs the first output signal based on the feedback from the second output signal; and the second control circuit receives feedback from the first output signal and controls whether the bit line write driver outputs the second output signal based on the feedback from the first output signal.

In general, in one aspect, the present invention involves a method of minimizing the effect of clock skew in a bit line write driver comprising outputting a first signal and a second signal from the bit line write driver; controlling the outputting of the second signal from the bit line write driver based on feedback of the first signal; and controlling the outputting of the first signal from the bit line write driver based on feedback of the second signal.

In general, in one aspect, the present invention involves an apparatus for minimizing the effect of clock skew in a bit line write driver comprising means for outputting a first signal and a second signal from the bit line write driver; means for controlling the outputting of the second signal from the bit line write driver based on feedback of the first signal; and means for controlling the outputting of the first signal from the bit line write driver based on feedback of the second signal.

In general, in one aspect, the present invention involves a bit line write driver with minimized clock skew effect, comprising a first set of transistors for producing a first output signal, a second set of transistors for producing a second output signal; a first control circuit for controlling whether a first output signal is output from the bit line write driver based on feedback from the second output signal; and a second control circuit for controlling whether a second output signal is output from the bit line write driver based on feedback from the first output signal.

In general, in one aspect, the present invention involves an apparatus for minimizing the effect of clock skew on a bit line write driver, comprising a first set of transistors for producing a first output signal, a second set of transistors for producing a second output signal; a first delay for delaying the first output signal; a second delay for delaying the second output signal; a first control circuit for controlling whether a first output signal is output from the bit line write driver based on feedback from the delayed second output signal; a second control circuit for controlling whether a second output signal is output from the bit line write driver based on feedback from the delayed first output signal, and an inverter for inverting the input signal to produce the inverted input signal.

The first set of transistors comprising a first p-channel transistor; a second p-channel transistor; and a first n-channel transistor. The first p-channel transistor is connected gate to a clock signal, source to a pull-up voltage, and drain to drain with the second p-channel transistor. The second p-channel transistor is connected source to the pull-up voltage, and gate to gate with the first n-channel transistor. The first n-channel transistor is connected gate to an input signal, and source to drain with a pull-down transistor. The pull-down transistor is connected gate to the clock signal, and source to ground.

The second set of transistors comprises a third p-channel transistor; a fourth p-channel transistor; and a second n-channel transistor. The third p-channel transistor is connected gate to the clock signal, source to the pull-up voltage, and drain to drain with the fourth p-channel transistor. The fourth p-channel transistor is connected source to the pull-up voltage, and gate to gate with the third n-channel transistor. The third n-channel transistor is connected gate to an inverted input signal, and source to drain with the pull-down transistor.

The first control circuit comprises a first control p-channel transistor; and a first control n-channel transistor. The first control p-channel transistor is connected gate to the feedback of the delayed second output signal, source to a pull-up voltage, and drain to drain with the first p-channel transistor and the second p-channel transistor. The first control n-channel transistor is connected gate to the feedback of the delayed second output signal, drain to drain with the first control p-channel transistor, the first p-channel transistor, and the second p-channel transistor, and source to the drain of first n-channel transistor.

The second control circuit comprises a second control p-channel transistor; and a second control n-channel transistor. The second control p-channel transistor is connected gate to the feedback of the delayed first output signal, source to a pull-up voltage, and drain to drain with the third p-channel transistor and the fourth p-channel transistor. The second control n-channel transistor is connected gate to the feedback of the delayed first output signal, drain to drain with the second control p-channel transistor, the third p-channel transistor, and the fourth p-channel transistor, and source to the drain of second n-channel transistor.

Other aspects and advantages of the invention will be apparent from the following description and the appended claims.

DETAILED DESCRIPTION

Figure 1:
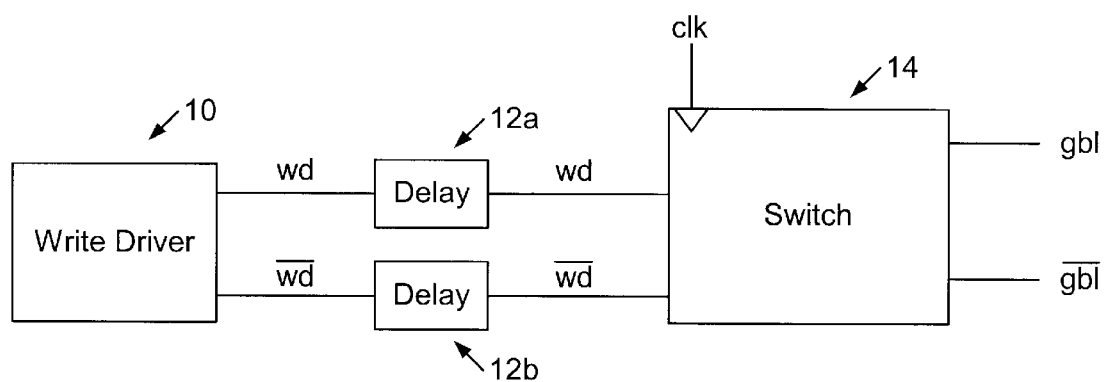
FIG. 1 shows a block diagram of conventional bitline write driver.
Figure 2:
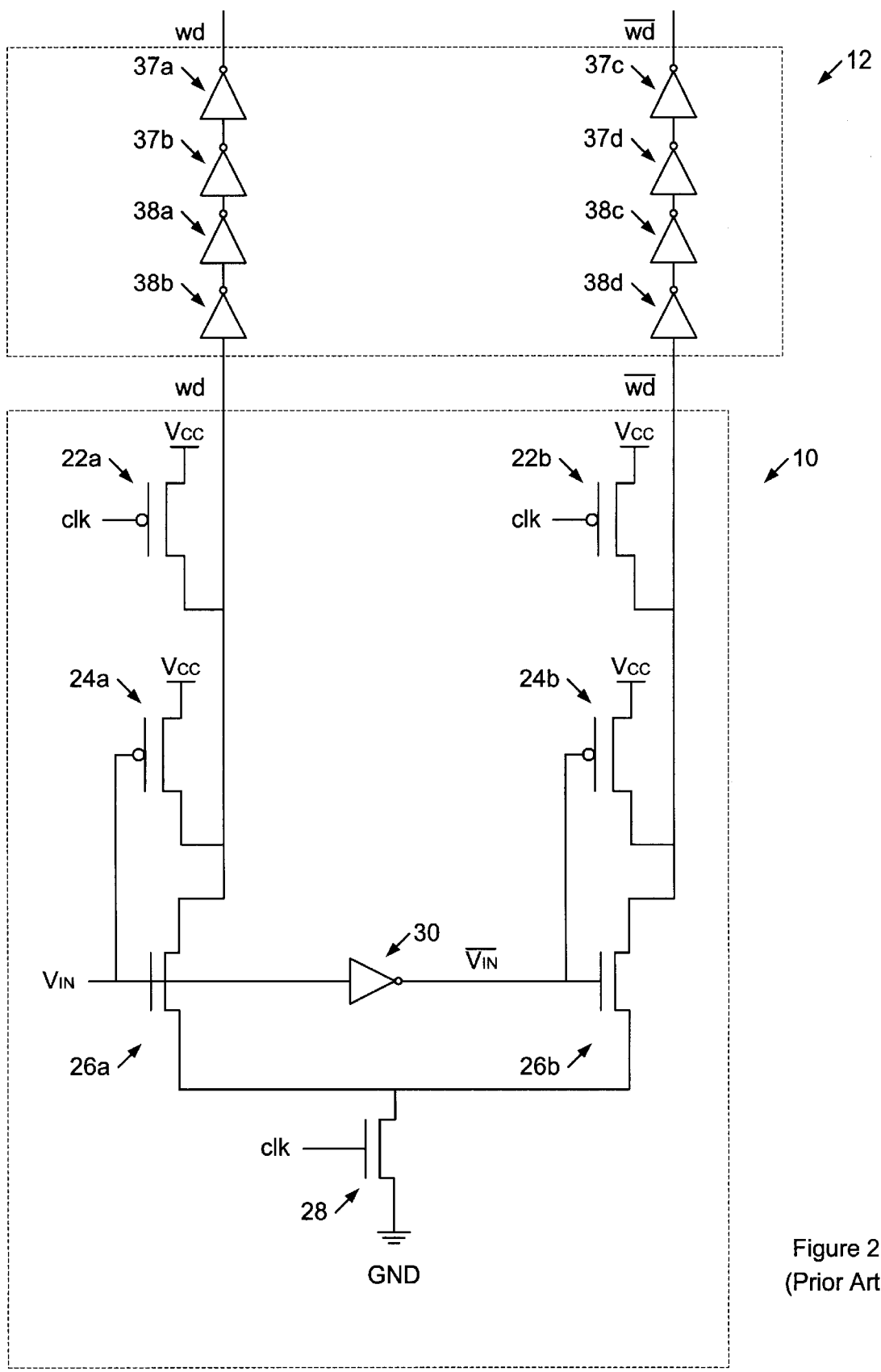
FIG. 2 shows a schematic of conventional write driver and delay stage.
Figure 3:
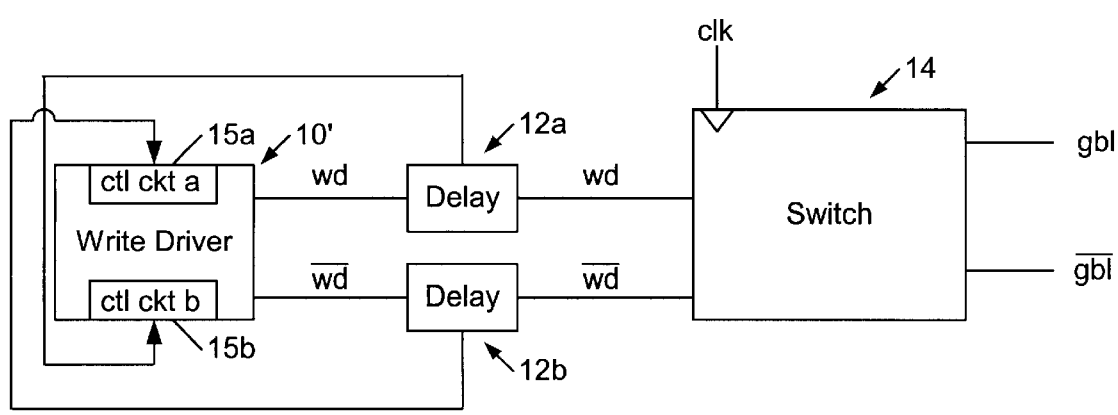
FIG. 3 shows a block diagram of an embodiment of the present invention.

Referring to the drawings wherein like reference characters are used for like parts throughout the several views, FIG. 3 shows an embodiment in accordance with the present invention. Generally, in one or more embodiments, the invention can be embodied in an a method and apparatus for minimizing the effect of clock skew in a bit line write driver.

As can be seen, the general structure of the system is the same, i.e., write driver 10' outputs two signals (wd and $\overline{wd}$) through delays (12a and 12b) to switch 14. Switch 14 also receives a clock signal that is used to control the output of the signals (wd and $\overline{wd}$) to the global bitline (gbl) and its complement ($\overline{gbl}$). Further, the write driver 10' includes control circuitry for receiving feedback from each output line (wd and $\overline{wd}$) at the delay stages (12a and 12b). This feedback is used to control the transition of the write driver output lines (wd and $\overline{wd}$). The operation of this control circuitry and feedback is discussed in greater detail with reference to the exemplary circuit diagram shown in FIG. 4.

Figure 4:
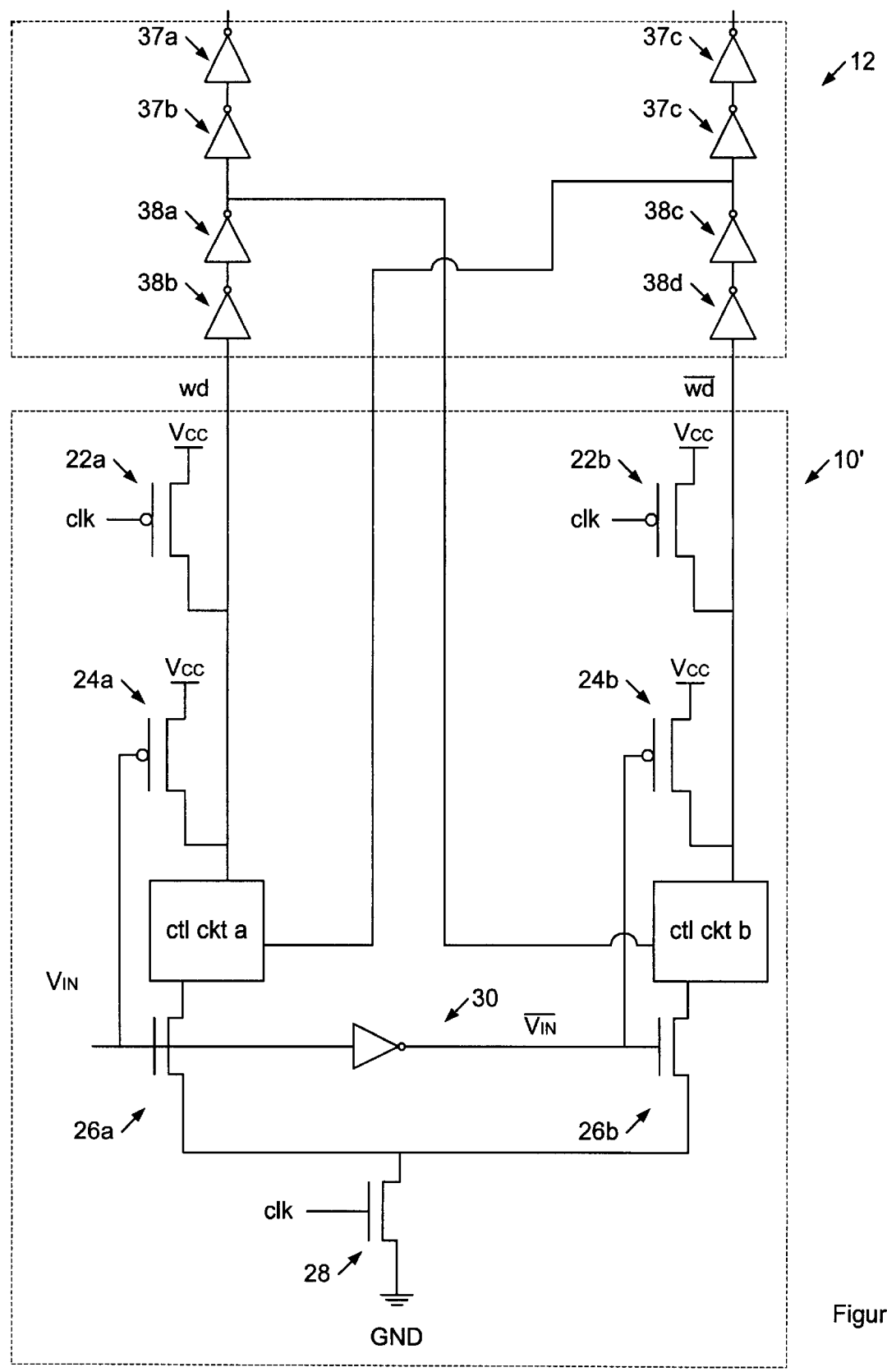
FIG. 4 shows a schematic of an embodiment of the present invention.

Referring to FIG. 4, a write driver (10') and delay stage (12) is shown. The write driver (10') comprises of two sets of transistors which produce the output signals (wd and $\overline{wd}$) respectively. Specifically, the set of transistors producing the output signal (wd) includes a p-channel transistor (22a), a p-channel transistor (24a), and an n-channel transistor (26a). The p-channel transistor (22a) receives a clock-derived signal, e.g., the clock signal (clk) at the gate, is connected at the source to pull-up voltage (Vcc), and is coupled drain to drain with p-channel transistor (24a). The p-channel transistor (24a) is also connected to pull-up voltage (Vcc) at the source, and is coupled gate to gate with n-channel transistor (26a) through a Control Circuit A (15a).

The Control Circuit A receives a feedback signal from the output of the complement output ($\overline{wd}$). The feedback signal may returned from the output ($\overline{wd}$) after the delay stage (12). The n-channel transistor (26a) receives an input signal (Vin) at the gate, and at the source is coupled through pull-down transistor (28) to ground (GND). The pull-down transistor (28) receives the clock signal (clk) at the gate, is coupled to n-channel transistor (26a) at the drain, and connected to ground (GND) at the source. Those skilled in the art will appreciate that the pull-down transistor (28) could also be implemented, as shown in FIG. 5, as two separate pull-down transistors, one for each side of the circuit.

The set of transistors producing ($\overline{wd}$) are connected similarly, wherein transistors 22b, 24b, and 26b have the same interconnections as 22a, 24a, and 26a respectively. Also, the Control Circuit B (15b) likewise receives a feedback signal from the complement output (wd). As can be seen, however, the input signal received by n-channel transistor (26b) passes through inverter (30) to become ($\overline{\text{Vin}}$). Thus, the output of the two sets of transistors are complements (wd and $\overline{\text{wd}}$). The output signals (wd and $\overline{\text{wd}}$) are fed to the delay stage (12), which, for example, comprises of two pairs of inverters (38a, 38b and 37a, 37b) and (38c, 38d and 37c, 37d) respectively.

Figure 5:
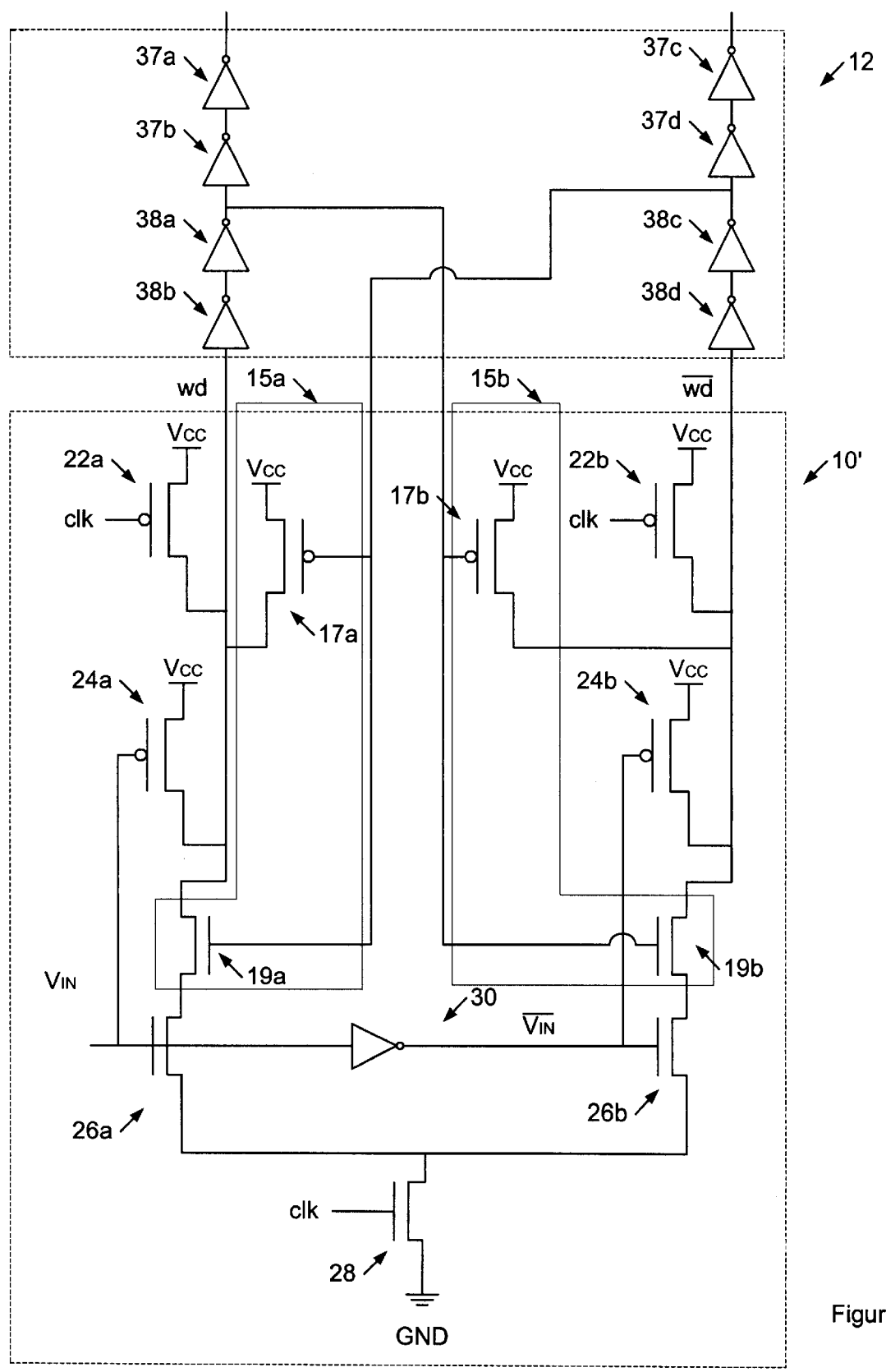
FIG. 5 shows a schematic of an exemplary embodiment of the present invention.

Referring to FIG. 5, an exemplary schematic of a circuit in accordance with an embodiment of the present invention is shown. As can be seen, the circuit comprises two sets of transistors 22a, 24a, 26a, and 22b, 24b, 26b coupled together with a pull-down transistor (28), inverter (30), and control circuits (15a and 15b) as discussed above with reference to FIG. 5. Also, delay stage (12) comprising, for instance, inverters (37a, 37b 37c, 37d, 38a, 38b, 38c, and 38d) are included.

In this exemplary embodiment, Control Circuit A (15a) comprises a p-channel transistor (17a) and an n-channel transistor (19a). The p-channel transistor (17a) is coupled to pull-up voltage (Vcc) at the source, receives a feedback signal from the output of inverter (38c), and is connected at the drain to the drain of transistors (22a) and (24a). The n-channel transistor (19a) receives the feedback signal from inverter (38c) at the gate, is coupled at the drain to the drain of transistors (22a), (24a), and (17a), and at the source is connected to the drain of transistor (26a). Similarly, Control Circuit B (15b) comprises a p-channel transistor (17b) and an n-channel transistor (19b). The p-channel transistor (17b) and n-channel transistor (19b) are coupled together with transistors (22b), (24b), and (26b) as transistors (17a) and (19a) are coupled with transistors (22a), (24a), and (26a) respectively.

Advantages of the present invention may include one or more of the following. The output of a local write data buffer is prevented from switching until both outputs are precharged after a write finishes. The hold time for write drivers closer to the global write data driver are improved without affecting the setup time of write drivers that are farther away.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A bit line write driver with minimized clock skew effect, comprising:
   a first set of transistors for producing a first output signal, wherein the first set of transistors comprises:
      a first p-channel transistor;
      a second p-channel transistor; and
      a first n-channel transistor;
      the first p-channel transistor is connected gate to a clock signal, source to a pull-up voltage, and drain to drain with the second p-channel transistor;
      the second p-channel transistor is connected source to the pull-up voltage, and gate to gate with the first n-channel transistor;
      the first n-channel transistor is connected gate to an input signal, and source to drain with a pull-down transistor;
      the pull-down transistor is connected gate to the clock signal, and source to ground; and
   a second set of transistors for producing a second output signal, wherein the second set of transistors comprises:
      a third p-channel transistor;
      a fourth p-channel transistor; and
      a second n-channel transistor;
      the third p-channel transistor is connected gate to the clock signal, source to the pull-up voltage, and drain to drain with the fourth p-channel transistor;
      the fourth p-channel transistor is connected source to the pull-up voltage, and gate to gate with the second n-channel transistor;
      the second n-channel transistor is connected gate to an inverted input signal, and source to drain with the pull-down transistor; and
   a first control circuit for controlling whether the first output signal is output from the bit line write driver based on feedback from the second output signal; and
   a second control circuit for controlling whether the second output signal is output from the bit line write driver based on feedback from the first output signal,
   wherein the first set of transistors are operatively coupled to the second set of transistors gate to gate, and the first set of transistors are operatively coupled to the second set of transistors drain to source through the first and second control circuits.

2. The bit line write driver of claim 1, further comprising: an inverter for inverting the input signal to produce the inverted input signal.

3. The bit line write driver of claim 1, further comprising:
   a first pair of inverters for delaying the feedback of the first signal; and
   a second pair of inverters for delaying the feedback of the second signal.

4. A bit line write driver with minimized clock skew effect, comprising:
   a first set of transistors for producing a first output signal;
   a second set of transistors for producing a second output signal;
   a first control circuit for controlling whether the first output signal is output from the bit line write driver based on feedback from the second output signal, wherein the first control circuit comprises:
      a first control p-channel transistor; and
      a first control n-channel transistor,
      the first control p-channel transistor connected gate to the feedback of the second output signal, source to a pull-up voltage, and drain to the first set of transistors;
      the first control n-channel transistor is connected gate to the feedback of the second output signal, drain to drains with the first control p-channel transistor and the first set of transistors, and source to the first set of transistors; and
   a second control circuit for controlling whether the second output signal is output from the bit line write driver based on feedback from the first output signal, wherein the second control circuit comprises:
      a second control p-channel transistor; and
      a second control n-channel transistor,
      the second control p-channel transistor is connected gate to the feedback of the first output signal, source to a pull-up voltage, and drain to the second set of transistors;
      the second control n-channel transistor is connected gate to the feedback of the first output signal, drain to drains with the second control p-channel transistor and the second set of transistors, and source to the second set of transistors, wherein the first set of transistors are operatively coupled to the second set of transistors gate to gate, and the first set of transistors are operatively coupled to the second set of transistors drain to source through the first and second control circuits.

5. An apparatus for minimizing the effect of clock skew on a bit line write driver, comprising:

a first set of transistors for producing a first output signal, a second set of transistors for producing a second output signal;

a first delay for delaying the first output signal;

a second delay for delaying the second output signal;

a first control circuit for controlling whether the first output signal is output from the bit line write driver based on feedback from the delayed second output signal;

a second control circuit for controlling whether the second output signal is output from the bit line write driver based on feedback from the delayed first output signal;

the first set of transistors comprising:
- a first p-channel transistor;
- a second p-channel transistor; and
- a first n-channel transistor;
- the first p-channel transistor is connected gate to a clock signal, source to a pull-up voltage, and drain to drain with the second p-channel transistor;
- the second p-channel transistor is connected source to the pull-up voltage, and gate to gate with the first n-channel transistor;
- the first n-channel transistor is connected gate to an input signal, and source to drain with a pull-down transistor;
- the pull-down transistor is connected gate to the clock signal, and source to ground; and the second set of transistors comprises:
- a third p-channel transistor;
- a fourth p-channel transistor; and
- a second n-channel transistor;
- the third p-channel transistor is connected gate to the clock signal, source to the pull-up voltage, and drain to drain with the fourth p-channel transistor;
- the fourth p-channel transistor is connected source to the pull-up voltage, and gate to gate with the third n-channel transistor;
- the third n-channel transistor is connected gate to an inverted input signal, and source to drain with the pull-down transistor;

the first control circuit comprises:
- a first control p-channel transistor; and
- a first control n-channel transistor,
- the first control p-channel transistor is connected gate to the feedback of the delayed second output signal, source to the pull-up voltage, and drain to drains with the first p-channel transistor and the second p-channel transistor;
- the first control n-channel transistor is connected gate to the feedback of the delayed second output signal, drain to drains with the first control p-channel transistor, the first p-channel transistor, and the second p-channel transistor, and source to the drain of first n-channel transistor; and the second control circuit comprises:
- a second control p-channel transistor; and
- a second control n-channel transistor,
- the second control p-channel transistor is connected gate to the feedback of the delayed first output signal, source to the pull-up voltage, and drain to drains with the third p-channel transistor and the fourth p-channel transistor;

the second control n-channel transistor is connected gate to the feedback of the delayed first output signal, drain to drains with the second control p-channel transistor, the third p-channel transistor, and the fourth p-channel transistor, and source to the drain of second n-channel transistor; and an inverter for inverting the input signal to produce the inverted input signal.

* * * * *